United States Patent
Willis

(10) Patent No.: US 7,298,220 B2
(45) Date of Patent: Nov. 20, 2007

(54) METHOD AND APPARATUS FOR CREATING A MULTIPLE LOOP VCO

(75) Inventor: Andre Willis, Menlo Park, CA (US)

(73) Assignee: SyntheSys Research, Inc, Menlo Park, CA (US)

( * ) Notice: Subject to any disclaimer, the term of this patent is extended or adjusted under 35 U.S.C. 154(b) by 71 days.

(21) Appl. No.: 11/371,321

(22) Filed: Mar. 7, 2006

(65) Prior Publication Data

US 2006/0208813 A1   Sep. 21, 2006

(51) Int. Cl.
  *H03L 7/00*   (2006.01)
(52) U.S. Cl. .......................... 331/16; 331/74; 332/117; 332/119; 332/127; 332/123; 375/376
(58) Field of Classification Search ................. 331/16, 331/74; 332/117, 19, 127, 123; 375/376
See application file for complete search history.

(56) References Cited

U.S. PATENT DOCUMENTS 6,700,447 B1 *   3/2004   Nilsson ...................... 331/10

* cited by examiner

*Primary Examiner*—Arnold Kinkead
(74) *Attorney, Agent, or Firm*—Peninsula IP Group; Douglas A. Chaikin

(57) ABSTRACT

Disclosed herein is a method and apparatus used to create an idealized voltage controlled oscillator (VCO) which allows very high modulation rates without the expected phase noise (jitter) which nominally comes from wide bandwidth VCOs. In this fashion, high quality VCOs that typically offer pure signals at the cost of small tuning bandwidths can be enhanced to create idealized VCOs that offer both high quality (low jitter) and high tuning bandwidths. A high-frequency phase modulator and control voltage processing is used in conjunction with a natural VCO to create a method and apparatus in accordance with the invention. The control voltage processing includes separation of frequency components of the controlling voltage and electrical integration of high-frequency control voltage components directed to the phase modulator to create the overall voltage-to-frequency transfer function for the ideal VCO.

5 Claims, 2 Drawing Sheets

IDEALIZED VOLTAGE CONTROLLED OSCILLATOR

FREQ. SYHNTHESIZER WITH FM CAPABILITY

METHOD AND APPARATUS FOR CREATING A MULTIPLE LOOP VCO

BACKGROUND OF THE INVENTION

1. Field of the Invention

This invention relates to systems and components that must create varied synthesized clock frequencies with abilities for high-frequency modulation rates with low phase noise jitter. More particularly this invention relates to systems and components that which include clock recovery systems that track very high frequency components of data jitter when extracting clocking signals from data streams.

2. Description of the Related Art

Multi-gigabit per second communications links have recently been standardized in numerous applications; each of which have slightly different requirements and therefore slightly different specifications. Applications from 150 Mbit/sec to 12 Gbit/sec are commonplace and each requires development and evaluation in their individual environment. A single clock recovery module that offers the dynamic range and flexibility to allow convenient settings to adapt the module for use in each individual environment is desired. Key to this achievement, is the creation of a phase-locked loop within a clock recovery module that operates at all the required data rates and that allows adjustable phase locked loop transfer characteristics (bandwidth and peaking/damping) to allow emulation of a "golden" phase locked loop in that application. In order to make such a phase locked loop that covers today's modern range of data rates and loop transfer characteristics with sufficient quality, it is vital that a new voltage-controlled oscillator be invented that offers pure oscillations (low jitter) as well as high-bandwidth frequency controllability.

Present voltage-control oscillators used in phase-locked loops employ various ways to cause oscillations and various ways to modulate the frequency of these oscillations. Examples of these devices include semiconductor ring oscillators typically tuned by electrically adjusting the time delay in the path around the ring, Inductor-Capacitor (LC) tank circuits who's capacitance can be varied electronically causing different oscillation frequencies, and Yttrium Iron Garnet (YIG) oscillators who's oscillations are caused by amercing the YIG sphere in a magnetic field building a microwave tank circuit allowing a modulation of the magnetic field to cause a modulation in the oscillator's frequency.

Of these and many other oscillator technologies, the YIG-style oscillator offers a large dynamic range of oscillation frequencies and a very pure oscillation tone (high-Q)—owing to its mechanical structure. However, as is common in any oscillator where the frequency of oscillation is adjusted by changing an input control voltage, any attempt to support high-frequency modulation of the oscillator's frequency (through the input control voltage) results in high phase noise of the oscillator's output. This is because an oscillator that can oscillate at a wide-range of frequencies will, by definition, respond to a large range of input control frequency spectra and an unavoidable large amount of energy will also accompany any real control voltage signal as noise. This noise will also fall into the allowed input control frequency spectra and any voltages found on the input control frequency (intended or not) will change the output frequency of the oscillator. It is well understood that the output phase noise of the entire phased-locked loop is the integral of the frequency variations. Thus, in-band noise energy will be integrated and will cause the classic VCO to have large phase noise when wide adjusting bandwidths are desired. Phase noise translates directly to jitter which is one of the key performance metrics for a clock output derived from the phased-lock loop inside a clock recovery unit.

Fundamentally, then, all phase-locked loops that directly employ a singular voltage controlled oscillator (VCO) where output phase of the oscillator is locked and adjusted by changing the frequency of oscillation of the VCO are plagued with added phase noise when attempting high-frequency modulation caused by the realization that the output phase is the integral of the controlled frequency. As is understood by those skilled in the art, the high frequency modulation element cannot be "inside" the oscillation loop (where integral of frequency relates to output phase noise).

In order to overcome the above, what is needed is the high frequency modulation element to be outside the loop (e.g. in the form of a phase modulator) where the phase error is not the integral of the control signal but rather just directly related to it. In accordance with the spirit and scope of this invention such a structure is provided.

SUMMARY OF THE INVENTION

An object of the present invention is to create a VCO whose output phase noise is not degraded when modulating the frequency at high rates.

In accordance with the objects and advantages of the invention, such an apparatus and method is achieved by creating a VCO that uses both an oscillating circuit (a natural VCO) and a fast phase modulating circuit in tandem. This structure has the outward appearance of a nearly ideal VCO, while not integrating unwanted noise into output phase error (or jitter).

The apparatus in accordance with the invention includes combining the frequency controls of a clean, high-quality (natural) VCO with the phase controls of a fast phase modulator. Then in an exemplary embodiment, using the result of phase modulating the output of the high quality natural VCO as the overall (ideal) VCO's output. In the apparatus, in accordance with the invention, The controls are combined in such a way as to get a smooth frequency cross-over such that the various desired rates of voltage control modulation as needed by the phase-locked loop and user application are separated and processed by the appropriate element (either of multiple possible frequency modulation methods for the natural VCO or the direct phase modulator).

The control voltage processing first separates the frequency components of the controlling signals to direct them to the appropriate mechanism and also electronically integrates any signals heading towards the phase modulator to mimic the voltage-to-frequency transfer characteristic required of a VCO. Electronic integration (e.g. an R-C or low-pass filter) is an averaging process that removes noise thereby creating an overall clean voltage-to-frequency transfer function in the overall ideal VCO, which is significantly better than any natural VCO.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

The present invention will now be described in greater detail with reference to the accompanying drawings, in which the preferred embodiments of the invention are shown. The present invention may, however, be embodied in many different forms and should not be construed as limited to the embodiment set forth herein; rather these embodiments are provided so that this disclosure will be thorough and complete and will fully convey the invention to those skilled in the art.

Figure 1:
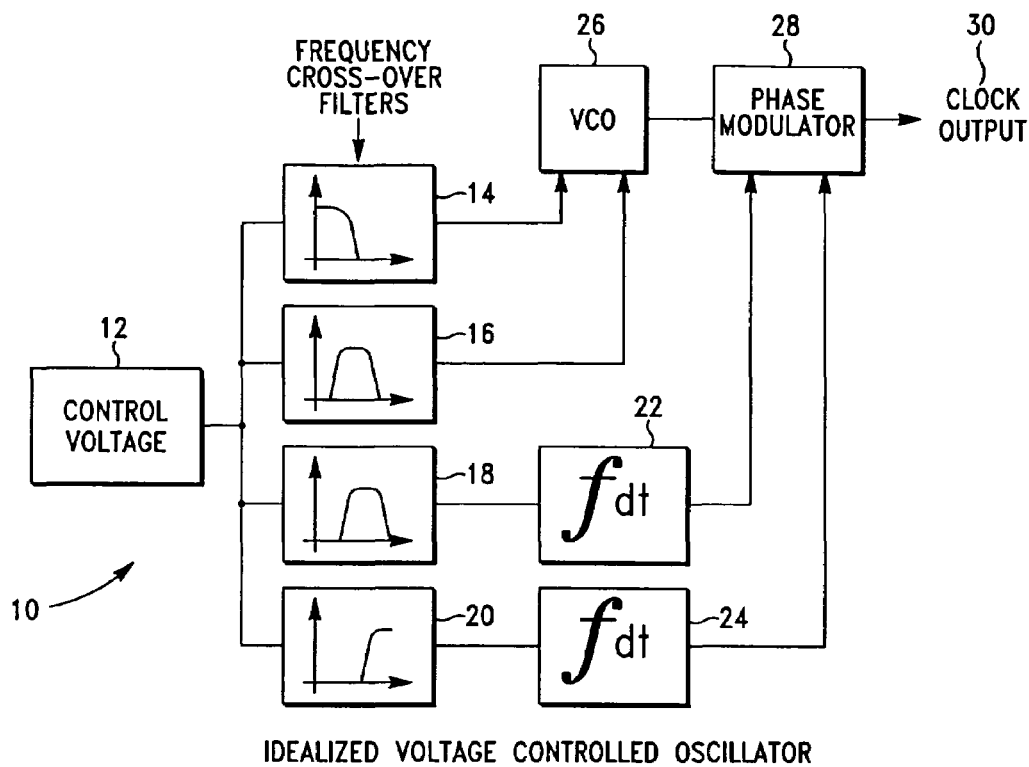
FIG. 1 is a schematic representation of the apparatus in accordance with the present invention for creating a multi-loop VCO.

FIG. 1 illustrates in schematic block diagram the apparatus of this invention, generally designated by the numeral 10. The apparatus 10 comprises a voltage-controlled oscillator, which uses a control voltage signal 12. The apparatus 10 is an idealized device that outputs a given frequency of oscillation as a function of a controlled input voltage. Additionally, the apparatus 10 includes frequency cross-over filters 14, 16, 18 and 20. The apparatus 10 further includes integrators 22 and 24 in the signal paths as shown in FIG. 1. Additionally included are a VCO 26 and a phase modulator 28.

A control voltage 12 is inputted to the apparatus 10, which instructs the apparatus 10 as to the frequency to oscillate. It will be appreciated that the clock output 30 is the resulting output frequency of the input signal after being processed by the apparatus. The frequency cross-over filters 14, 16, 18 and 20 split the various frequency components of the applied control voltage into different paths. The integrators 22 and 24 are located in the paths as shown. These paths use phase modulation techniques to achieve a frequency-modulation effect, a normal voltage controlled oscillator and a phase modulator.

In accordance with the objects herein, the invention not only supports voltage controlled oscillation, but also allows a very high-speed rate of change and large range of control voltage. Hence, a very high modulation bandwidth and range are achieved without the normal amount of expected jitter that would ordinarily accompany a normal VCO-style implementation.

As illustrated in FIG. 1, the low frequency components are stripped-off and handed off to a voltage controlled oscillator. On the other hand, the high-frequency components are separated and handed off to an electronic integrator. Then the result is used to phase modulate the resulting voltage controlled oscillator output to enact the final result, a clock output that tracks both low and high frequency control voltage inputs.

FIG. 1 also illustrates multiple bands of frequency being separated out from the control voltage input to take advantage of different speeds of frequency (in the case of the VCO) or phase (in the case of the phase modulator) modulation capabilities. FIG. 1 is an exemplary embodiment illustrating four bands in use. In an exemplary embodiment illustrated in FIG. 1, the two low-frequency components corresponds to the two control mechanisms found in a YIG oscillator, whereby one coil is used to set the very low frequency components of the control voltage, for example, DC-1 KHz and a smaller coil is used to achieve higher frequency components 1 Khz-500 KHz.

Similarly, the two high-frequency components in the exemplary embodiment of FIG. 1 correspond to the two different phase modulation techniques that offer the range and tuning frequency to cover the modulation range of interest. For example, some phase modulations operate with large phase change ranges, but only up to a certain rate of phase modulation. Other phase modulators operate within a small range of phase change, but do so at very high frequencies. The apparatus 10 and the method the invention are capable of handling both.

Integrators 22 and 24 are necessary for the paths that use phase modulators. Phase modulation is not frequency modulation and frequency modulation is what is required in a VCO. In order to change from phase modulation to frequency modulation, it is necessary to integrate the amount of phase change over time—that is, the integral of phase modulation is frequency modulation. One way to thing of this is that if you increase a control voltage to a phase modulator, it is possible to push an edge to occur somewhat later (or earlier) in time. However, when the control voltage to a voltage controlled oscillator is increased, the frequency of the oscillator shifts slightly increasing (or decreasing) the clock period ever so slightly of the output signal. This causes the next bit period to be longer and hence pushes the next bit to occur later (or earlier) in time. However, as the bit period is enlarged (or reduced), the next bit period will be pushed even further off. Consequently, the next subsequent bit farther will be pushed further the last bit.

It will be appreciated by those skilled in the art of electronic signal processing that integrating the amount of delay control given to a phase modulator over the range of the phase modulation allowed, makes the edges get later and later in time and hence, the edges appear as a frequency modulation.

Naturally, it will be appreciated that there is a limit to the extent a variable delay phase modulator can push an edge. This is limited by the range in the electronics. Therefore, the methodology described herein within the spirit and scope of the invention works for frequencies of modulations that are high, i.e. fit within the range of the phase modulator. High frequency variations will use smaller ranges in the variable delay element while lower frequency variations require larger ranges. The method and apparatus of the invention carefully picks the frequency handoff points between the VCO and phase modulation mechanisms so as to cover all frequency components of the applied input control voltage without running out of range of the phase modulators.

It is well known in the industry to use frequency modulation and phase modulation as virtual stand-ins for each other. However, such substitution is recommended only when sinusoidal (sine and cosine) modulation is being done. For additional broad-band modulation spectrum, a true frequency modulation (FM) is recommended.

Figure 2:
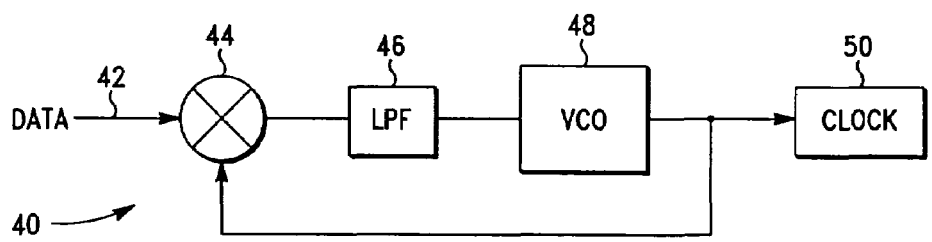
FIG. 2 illustrates a schematic representation of an exemplary implementation of the clock recovery.

FIG. 2 is a block diagram illustrating a data recovery circuit, generally denoted by the numeral 40. As shown, it is used for data recovery from a data stream 42. The circuit 40 includes, a phase detector 44, a low pass filter 46, a voltage controlled oscillator 48 and a reference sampling clock 50.

As illustrated in FIG. 2, the voltage controlled oscillator 48 is used in the clock recovery circuit 40. In the circuit 40, the reference sampling clock 50 is derived from edges present in data bits on a data stream 42. The phase detector 44 is used to identify whether the edge of the clock present comes from the voltage controlled oscillator 48 is ahead or behind the edge of the applied input data bit. In order to stay locked, when the voltage controlled oscillator 48 has an edge ahead of the data edge, the oscillator 48 frequency tends lower. Likewise, when the voltage controlled oscillator 48 has an edge behind the edge of the data bit, the frequency of the voltage controlled oscillator 40 tends toward being increased.

A low pass filter 46 sits between the phase detector 44 output and the voltage controlled oscillator 48 control input. The low pass filter 46 slows down the reaction speed of the phase detector 44. This enables the circuit 40 to set the frequency for tracking the edge variation of the phase-locked-loop. Using this method, the circuit can decide which signals will be used for tracking and which will be ignored.

In one exemplary embodiment of the circuit in accordance with this invention, the frequency tracking point low, thereby reducing the necessary control bandwidth of the input to the VCO 48. This method facilitates having a minimum amount of jitter from the VCO 48. It is a significant advantage of this invention to have a circuit with a wide bandwidth input range, while not significantly increasing the output jitter. It has been found to be greatly advantageous to track high frequency components of jitter that may be present in low-cost and noisy environments, but which could still be tolerated to achieve error-free communications when data tracking bandwidth raised.

Figure 3:
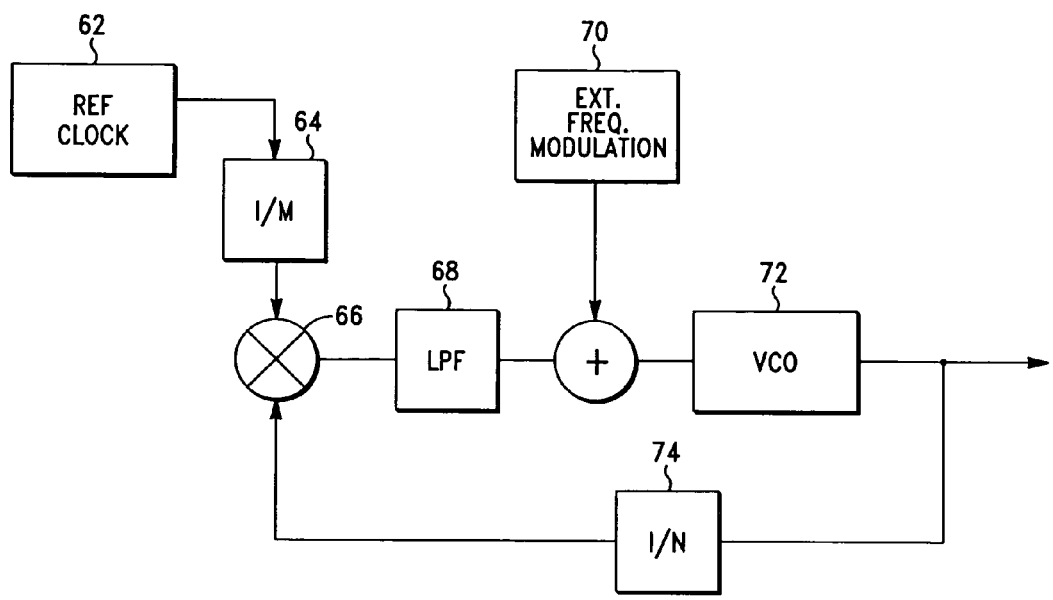
FIG. 3 illustrates a schematic representation of an exemplary implementation of the frequency synthesizer in accordance with this invention.

FIG. 3 is a block diagram illustrating a frequency synthesizer circuit having frequency modulation capability, generally denoted by the numeral 60. The circuit 60 includes a reference clock 62, a 1/M divider 64, a phase detector 66, a low pass filter 68, a frequency modulation input signal 70, a voltage controlled oscillator (VCO) 72 and a 1/N divider 74.

The circuit 60 derives an output synthesized clock frequency from reference clock 62. In the exemplary embodiment shown in FIG. 3, the synthesizer circuit 60 includes a typically desired feature of frequency modulation. This frequency modulation is accomplished by summing in a frequency modulation signal 70 into the signal that controls the voltage controlled oscillator 72 inside the synthesizer circuit 60.

The synthesizer uses understood methods to compare the phase of a divided version of a known reference clock to a similarly divided output of the voltage controlled oscillator 72. This phase-locked-loop (PLL) is in "lock" when the two frequencies present at the inputs to the phase detector match. In this way, the values of the two dividers (M and N) and the reference clock frequency specify the frequency of the output of the synthesizer. Again, the output of the phase detector is first low-pass filtered to reduce the tracking bandwidth that is desired in the loop. The frequency modulation input port shown in this FIG. 3 sums with the output of the low pass filter 68 creating the control voltage for the voltage controlled oscillator 72. By pushing this FM input higher in voltage, the output of the voltage controlled oscillator 72 shifts. Ordinarily, the bandwidth of the PLL, as set by the low pass filter 68, looks to be set to ignore the FM input signal so that the PLL does not "over-work" in removing the frequency modulation being injected externally.

The bandwidth of the input to the voltage controlled oscillator 72 sets useful frequency upper-limit for the synthesizer circuit 60. With circuit 60, the VCO blocks the signal that implements very high frequency control voltage modulation without additive jitter. Using the method of the invention as set forth in the exemplary embodiment of FIG. 3, greatly enhances the high-frequency FM capability of the synthesizer circuit 60.

It will be appreciated by those skilled in the art that other phase locked loop architectures including those that take advantage of fractional-N phase detection methods also similarly have extended modulation rate enhancement if the voltage controlled oscillators within their designs have superior high-frequency modulation capabilities without sacrificing added jitter.

What is claimed is:

1. A multi-loop voltage controlled oscillator, comprising:
   at least a first two cross-over frequency filters operative to provide the low frequency components of a control signal to a voltage controlled oscillator;
   at least another two cross-over frequency filters operative to strip off the high frequency components of the control signal;
   a pair of integrators operative to provide the phase characteristics of the control signal in response to the high frequency components of the control signal; and
   a phase oscillator operative to phase modulate the output of the voltage controlled oscillator in response to the integrated phase characteristics of the control voltage.

2. The multi-loop voltage controlled oscillator of claim 1, wherein a first of the the first two cross-over frequency filters provide the frequency characteristics of the control signal in a first frequency range.

3. The multi-loop voltage controlled oscillator of claim 1, wherein a second of the first two cross-over frequency filters provide the frequency characteristics of the control signal in a second frequency range.

4. The multi-loop voltage controlled oscillator of claim 1, wherein the first of the two integrators provides the phase characteristics of the control signal by integrating the frequency characteristics of the control signal in a third frequency range.

5. The multi-loop voltage controlled oscillator of claim 1, wherein the second of the two integrators provides the phase characteristics of the control signal by integrating the frequency characteristics of the control signal in a fourth frequency range.

* * * * *